US008854313B2

(12) United States Patent
Takeda

(10) Patent No.: US 8,854,313 B2
(45) Date of Patent: Oct. 7, 2014

(54) SENSOR-INTEGRATED ILLUMINATED KEY SHEET

(75) Inventor: Yasunori Takeda, Tokyo (JP)

(73) Assignee: Polymatech Co., Ltd., Tokyo (JP)

( * ) Notice: Subject to any disclaimer, the term of this patent is extended or adjusted under 35 U.S.C. 154(b) by 104 days.

(21) Appl. No.: 13/518,808

(22) PCT Filed: Dec. 21, 2010

(86) PCT No.: PCT/JP2010/072996
§ 371 (c)(1),
(2), (4) Date: Jun. 22, 2012

(87) PCT Pub. No.: WO2011/081059
PCT Pub. Date: Jul. 7, 2011

(65) Prior Publication Data
US 2012/0256844 A1    Oct. 11, 2012

(30) Foreign Application Priority Data

Dec. 28, 2009  (JP) ................................ 2009-298664

(51) Int. Cl.
| G06F 3/02 | (2006.01) |
| G09G 5/00 | (2006.01) |
| H04L 17/04 | (2006.01) |
| H04L 17/02 | (2006.01) |
| H03K 17/96 | (2006.01) |
| G06F 3/044 | (2006.01) |

(52) U.S. Cl.
CPC ...... *G06F 3/044* (2013.01); *H03K 2217/96079* (2013.01); *H03K 17/9622* (2013.01); *G06F 3/0202* (2013.01); *H03K 17/962* (2013.01)
USPC ......... 345/170; 345/168; 178/17 C; 178/17 A

(58) Field of Classification Search
USPC .............................. 345/168, 170, 17 C, 17 A
See application file for complete search history.

(56) References Cited

U.S. PATENT DOCUMENTS

| 2002/0101399 A1* | 8/2002 | Kubo et al. .................... 345/104 |
| 2003/0016211 A1* | 1/2003 | Woolley ........................ 345/173 |

(Continued)

FOREIGN PATENT DOCUMENTS

| EP | 2141722 A1 | 1/2010 |
| JP | 2008-139961 A | 6/2008 |

(Continued)

OTHER PUBLICATIONS

International Search Report for PCT Patent App. No. PCT/JP2010/072996 (Feb. 1, 2011).

*Primary Examiner* — Aneeta Yodichkas
(74) *Attorney, Agent, or Firm* — Cermak Nakajima McGowan LLP; Tomoko Nakajima

(57) ABSTRACT

There is provided a technique which can reduce the entire thickness of a push-button switch while securing the brightness of the illumination and can increase the sensitivity and accuracy of a slide input. Use of a light guide sheet separating from a surface-type capacitance sensor is excluded, thereby being able to reduce the entire thickness of a sensor-integrated illuminated key sheet while a light guide sheet serves to secure the brightness of the illumination. A surface sheet is provided so as to contact the operation surface side of the light guide sheet as the substrate of the surface-type capacitance sensor. The distance between the operation surface of the surface sheet and the surface-type capacitance sensor can therefore decrease, which can enhance the sensitivity and accuracy of the slide input.

12 Claims, 9 Drawing Sheets

(56) References Cited

U.S. PATENT DOCUMENTS

2009/0200148 A1* 8/2009 Honmatsu et al. ............ 200/5 A
2010/0002018 A1* 1/2010 Hirata ........................... 345/690
2010/0214245 A1* 8/2010 Hirota ........................... 345/173
2011/0278145 A1* 11/2011 Takeda et al. ................. 200/314

FOREIGN PATENT DOCUMENTS

| JP | 2008-270000 A | | 11/2008 |
|----|---------------|---|---------|
| JP | 2009-146707 A | | 7/2009 |
| JP | 2009-187854 A | | 8/2009 |
| WO | WO/2010/070956 | * | 6/2010 |

* cited by examiner

SENSOR-INTEGRATED ILLUMINATED KEY SHEET

This application is a national phase entry under 35 U.S.C. §371 of PCT patent Application No. PCT/JP2010/072996, filed on Dec. 21, 2010, which claims priority under 35 U.S.C. §119 to Japanese Patent Application No. 2009-298664, filed Dec. 28, 2009, both of which are incorporated by reference.

TECHNICAL FIELD

The present invention relates to a sensor-integrated illuminated key sheet which can be incorporated in various types of electronic equipment, for example, information equipment such as cellular phones, personal handyphone systems (PHSs), personal digital assistants (PDAs), navigation systems, and laptops; audio visual (AV) equipment such as small audio players and portable music players; game machines; and controllers for the game machines.

BACKGROUND ART

Various types of electronic equipment, for instance, information equipment, AV equipment, and game machines, have an input member such as a push-button switch which determines the on/off state of a switch in response to pressing of a push-button. The push-button switch to be used has a configuration in which a key sheet having a push-button (key top) overlies a circuit board on which a contact switch is disposed. The push-button switch with such a configuration often has an illumination function to illuminate the key top of the key sheet with an internal light source disposed on the circuit board, thereby enabling easy operation even in a dark place.

The input by the push-button switch has been diversified with the development of various types of electronic equipment. In addition to pressing input for the binary input of the on/off state, a slide input is demanded to input coordinates by actions such as a sweep and touch. For example, Japanese Unexamined Patent Application Publication No. 2008-139961 (Patent Literature 1) discloses an input device including a sensor-integrated illuminated key sheet 111 which has a key member 112, a light guide panel 113, a pressing sheet 114, and a coordinate-inputting unit 115 as illustrated in FIG. 18. In this input device, a metallic dome functions as a contact switch for the pressing input, and the coordinate-inputting unit 115 serves for the slide input. The coordinate-inputting 115 has a structure in which a substrate 115a is disposed between a first electrode 115b and a second electrode 115c. In terms of the illumination, air spaces 116 are formed to the surface side of the light guide panel 113 to sufficiently secure the optical waveguide characteristics of the light guide panel 113, thereby enhancing the brightness of the key member 112.

CITATION LIST

Patent Literature

PTL 1: Japanese Unexamined Patent Application Publication No. 2008-139961

SUMMARY OF INVENTION

Technical Problem

The input device of Patent Literature 1 enables the pressing input and the slide input and has the illumination function. On the other hand, the input device has difficulty in reduction of its entire thickness because the individual parts are separately provided, which causes a problem in reduction in the size of electronic equipment including the input device. In addition, since millimeter-sized protrusions 113a are formed on the key member 112-facing surface of the light guide panel 113 to form the air spaces 116 between the key member 112 and the light guide plane 113, difficulty also arises in reduction of the entire thickness of the input device. Since the millimeter-sized air spaces 116, which are formed by the millimeter-sized protrusions 113a, increase the distance between the operation surface of the key member 112 and the coordinate-inputting unit 115, the sensitivity of the coordinate-inputting unit 115 becomes likely to decrease, resulting in the frequent occurrence of malfunction.

The study of the invention has been made in view of these technical backgrounds. It is an object of the invention to provide a technique which can reduce the entire thickness of a push-button switch while securing the brightness of the illumination and can increase the sensitivity and accuracy of a slide input.

Solution to Problem

In view of the above object, an aspect of the invention has the following configurations.

According to an aspect of the invention, a sensor-integrated illuminated key sheet is provided, the sensor-integrated illuminated key sheet including a light guide sheet which transmits light, an operation section provided so as to contact the operation surface side of the light guide sheet, and a capacitance sensor which serves for a slide input, wherein the light guide sheet functions as the substrate of the capacitance sensor, and the capacitance sensor includes an electrode formed on at least any one of the operation surface side and back side of the light guide sheet, the back side being opposite to the operation surface side.

In the invention, the light guide sheet functions as the substrate of the capacitance sensor. The light guide sheet can be therefore provided so as not to separate from the capacitance sensor, thereby being able to reduce the entire thickness of the key sheet while the light guide sheet serves to secure the brightness of the illumination. Electronic equipment including the sensor-integrated illuminated key sheet can accordingly have the decreased size.

In the case where the operation section having a slide operation surface is distant from a capacitance sensor with a millimeter-sized air space interposed therebetween, the air space increases the distance between the operation surface and a coordinate-inputting unit as described above. The capacitance sensor therefore has reduced sensitivity, resulting in the fear of the frequent occurrence of malfunction. In the invention, however, the operation section is provided so as to contact the operation surface side of the light guide sheet as the substrate of the capacitance sensor. The distance between the operation surface of the operation section and the capacitance sensor can accordingly decrease, thereby enhancing the sensitivity and accuracy of the slide input. The sensor-integrated illuminated key sheet which enables an accurate slide input can be consequently provided.

The operation section may include a plurality of key tops each having a block shape. By virtue of this configuration, positions to be pressed can be clearly recognized by visual observation and touch, which enables easy pressing input.

In the sensor-integrated illuminated key sheet with the operation section having the key tops, the operation section may include a frame sheet provided between the individual key tops. Owing to this configuration, the frame sheet can fill the gap between the individual key tops. If the gap between the individual key tops is enlarged, the upper surface of the key tops and the upper surface of the frame sheet can form a slide operation surface. Thus, roughness can be less likely to be formed on the slide operation surface, and the distance between the slide operation surface and the capacitance sensor can be maintained substantially constant. Hence, the capacitance sensor can have stable sensitivity, thereby enhancing the accuracy of the slide input. The increase in the gap between the individual key tops by the frame sheet can prevent the adjacent key tops from working together in a pressing input, which suppresses the occurrence of a wrong input in the pressing input.

In the operation section having the key tops, the frame of the case of electronic equipment can serve to fill the gap between the individual key tops in place of the frame sheet. In this structure, unfortunately, the distance between the key tops and the frame of the case is likely to become larger than the distance between the key tops and the frame sheet because of thermal contraction caused in formation of the case, which may provide poor appearance. Although the key tops can be closely arranged without the frame sheet, this structure causes the adjacent key tops to work together in a pressing input, resulting in the fear of the increase in the pressing load.

The key tops and frame sheet which function as the operation section of the sensor-integrated illuminated key sheet may be individually made from materials having the same dielectric constant. The capacitance sensor detects the change in electrostatic capacity generated between the electrode and a finger for a slide input. Even though the key tops and the frame sheet have substantially the same thickness, the difference in the dielectric constant between the key tops and the frame sheet causes the electrostatic capacity generated between the electrode and the finger to be varied between the case in which the finger contacts the upper surface of the key tops and the case in which the finger contacts the upper surface of the frame sheet. In this case, the capacitance sensor cannot accurately detect information, and a signal value transmitted from the capacitance sensor may cause malfunction. However, use of the materials having the same dielectric constant for the key tops and the frame sheet can prevent such malfunction, leading to enhancing the accuracy of the detection of the capacitance sensor. In order to impart the same dielectric constant to the key tops and frame sheet, the same material is preferably used for the key tops and the frame sheet. Use of the same material for the key tops and the frame sheet enables stable production with high precision by the same processing technique.

In the sensor-integrated illuminated key sheet with the operation section having the key tops, the key tops may be formed on a cover sheet which overlies the operation surface side of the light guide sheet. In particular, the operation section includes the key tops and the cover sheet. By virtue of this configuration, the cover sheet can cover the operation surface side of the capacitance sensor, thereby being able to prevent damage of components on the operation surface side of the capacitance sensor. The capacitance sensor can therefore have stable sensitivity, which can enhance the accuracy of the slide input. Furthermore, since the cover sheet on which the key tops are formed overlies and contacts the operation surface side of the light guide sheet, the distance between the operation surface of the operation section and the capacitance sensor can decrease, thereby enhancing the sensitivity and accuracy of the slide input. The sensor-integrated illuminated key sheet which enables an accurate slide input can be accordingly provided.

In the sensor-integrated illuminated key sheet with the operation section having the cover sheet, the cover sheet may have a blasted surface which faces the light guide sheet. The blasted surface refers to a finely uneven surface having micron-sized roughness. Owing to the blasted surface of the cover sheet which overlies and contacts the light guide sheet, micron-sized fine space can be formed to the operation surface side of the light guide sheet. Since the space has a refractive index smaller than that of the light guide sheet, the light transmitted inside the light guide sheet is easily reflected by the surface which faces the space, thereby being able to prevent the leak of the light from this surface to the outside. The efficiency of the light guiding of the light guide sheet can be therefore enhanced, leading to bright illumination.

In an aspect of the invention, the operation section may be a planar surface sheet having a certain thickness. This configuration enables the distance between the operation surface of the surface sheet and capacitance sensor to be maintained constant, leading to the stable sensitivity of the capacitance sensor. The capacitance sensor can therefore have high accuracy for the slide operation on the operation surface, which enables an accurate slide input.

The sensor-integrated illuminated key seat according to an aspect of the invention may have a transparent resin layer formed between the light guide sheet and the electrode. The electrode of the capacitance sensor is preferably formed on an even surface. It is because formation of the electrode on an uneven surface easily causes disconnection and therefore results in the fear of inaccurate detection of the electrostatic capacity. In contrast, formation of the electrode through the transparent resin layer as in an aspect of the invention provides the following advantage: even though another layer is partially formed on the operation surface and back surface of the light guide sheet or the operation surface and back surface of the light guide sheet has an uneven surface profile, the transparent resin layer can impart evenness to the uneven surface, thereby being able to form the electrode on an even surface. The electrostatic capacity can be therefore accurately detected, which enables a highly accurate slide input.

In the sensor-integrated illuminated key sheet having the transparent resin layer, the transparent resin layer may be made from a resin having a refractive index smaller than that of the light guide sheet. By virtue of this configuration, the efficiency of light reflection can be enhanced at the interface between the light guide sheet and the transparent resin layer, thereby being able to prevent the light transmitted inside the light guide sheet from entering the transparent resin layer. The light can be therefore prevented from leaking to the outside of the light guide sheet, and the efficiency of the light guiding of the light guide sheet can be accordingly enhanced.

In the sensor-integrated illuminated key sheet having the transparent resin layer, the transparent resin layer and the light guide sheet may have smooth surfaces which contact each other. Owing to this configuration, light can be prevented from diffusing at the interface between the light guide sheet and the transparent resin layer, and the light transmitted inside the light guide sheet can be efficiently reflected to the inside of the light guide sheet. The light transmitted inside the light guide sheet can be therefore prevented from entering the transparent resin layer, thereby eliminating the leak of the light to the outside of the light guide sheet.

The sensor-integrated illuminated key sheet according to an aspect of the invention may have a light-shielding print layer formed to the back side of the light guide sheet. The light-shielding print layer has the function to absorb or reflect light, and the light is less likely to pass through the light-shielding print layer. In the inside of the electronic equipment, light emitted from an internal light source does not partially enter the light guide sheet and is diffusely reflected between the sensor-integrated illuminated key sheet and a circuit board. In the case where the diffusely reflected light enters the light guide sheet from the back side of the sensor-integrated illuminated key sheet, the light is likely to be directly emitted from the operation surface side of the light guide sheet, and part of the operation section is unintentionally illuminated with the light. The light-shielding print layer, which is formed to the back side of the light guide sheet according to an aspect of the invention, can prevent the diffusely reflected light from entering the light guide sheet from the back side of the sensor-integrated illuminated key sheet, leading to good appearance during the illumination.

Especially in the sensor-integrated illuminated key sheets having the transparent resin layer formed on the back surface of the light guide sheet, the light-shielding print layer can be formed on the back surface of the transparent resin layer to absorb light. By virtue of this configuration, since the transparent resin layer interposed between the light guide sheet and the light-shielding print layer prevents the light inside the light guide sheet from entering the transparent resin layer, the light-shielding print layer is less likely to absorb the light inside the light guide sheet, thereby being able to enhance the efficiency of the light guiding of the light guide sheet even though the light-shielding print layer is provided.

Advantageous Effects of Invention

In the sensor-integrated illuminated key sheet according to an aspect of the invention, since the light guide sheet functions as the substrate of the capacitance sensor, the light guide sheet can be provided so as not to separate from the capacitance sensor, thereby being able to reduce the entire thickness of the key sheet while the light guide sheet serves to secure the brightness of the illumination. Electronic equipment including the sensor-integrated illuminated key sheet therefore can have the decreased size. The sensor-integrated illuminated key sheet includes the reduced number of components as described above and can be thus produced through simple processes.

In addition, since the operation section is provided so as to contact the operation surface side of the light guide sheet, the distance between the operation surface of the operation section and the capacitance sensor can be accordingly decreased, thereby enhancing the sensitivity and accuracy of the slide input. The sensor-integrated illuminated key sheet which enables an accurate slide input can be accordingly provided.

DESCRIPTION OF EMBODIMENTS

The invention will be hereinafter described further in detail with reference to the drawings. Embodiments are described on the basis of examples of a sensor-integrated illuminated key sheet used for input components of cell phones. The same configurations of the individual embodiments are denoted by the same reference signs to omit the same description. Furthermore, description of the same materials, effects, advantages, and manufacturing processes is also omitted.

Figures 1, 2:
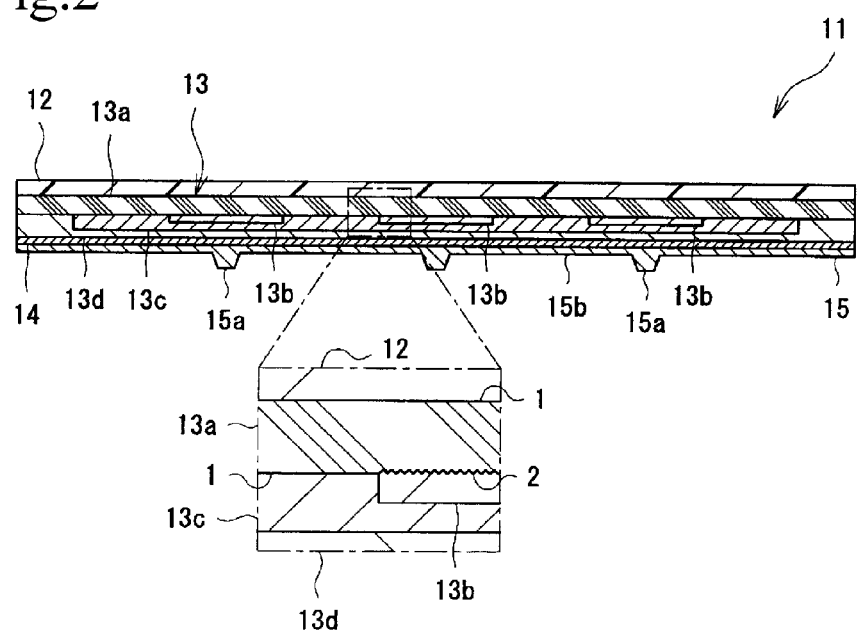
FIG. 1 is a plan view illustrating a sensor-integrated illuminated key sheet of a first embodiment.
FIG. 2 is a cross-sectional view illustrating the sensor-integrated illuminated key sheet taken along the line SA-SA in FIG. 1.

First Embodiment (FIGS. 1 and 2)

FIGS. 1 and 2 each illustrate a sensor-integrated illuminated key sheet 11 of a first embodiment. FIG. 1 is a plan view illustrating the sensor-integrated illuminated sheet 11. FIG. 2 is a cross-sectional view illustrating the sensor-integrated illuminated key sheet 11 taken along the line SA-SA. The sensor-integrated illuminated key sheet 11 has a surface sheet 12 as an "operation section", a surface-type capacitance sensor 13, a light-shielding print layer 14, and a pusher sheet 15.

The surface sheet 12 forms the operation surface side of the sensor-integrated illuminated key sheet 11 and has a planar shape with a certain thickness. A display layer (not illustrated) is formed on the back side of the surface sheet 12 and is attached so as to cover the entire surface of the surface-type capacitance sensor 13, the back side being opposite to the operation surface.

Transparent resin films are used as the material of the surface sheet 12. Especially preferred are highly transparent thermoplastic resin films. Examples of such materials include a polycarbonate resin film, a polymethyl methacrylate resin film, an acrylic resin film, a urethane resin film, and a polyethylene terephthalate resin film. Among these, preferred are a polycarbonate resin film, a polymethyl methacrylate resin film, an acrylic resin film, and a urethane resin film, each not having an area absorptive for wavelengths in a visible light region and having high transparency.

In this embodiment, the surface sheet 12 is attached to a light guide sheet 13a, which will be hereinafter described, of the surface-type capacitance sensor 13 by a double-sided tape (not illustrated). The light guide sheet 13a has a refractive index larger than that of the adhesive layer of the double-sided tape by 0.06 or higher, thereby being able to enhance the light reflection efficiency at the interface between the adhesive layer and the light guide sheet 13a. Light transmitted inside the light guide sheet 13a can be therefore prevented from entering the adhesive layer.

The surface-type capacitance sensor 13 serves for position detection in a slide input and includes the light guide sheet 13a as a substrate, diffusion layers 13b, an electrode 13c, and a transparent resin layer 13d.

Meanwhile, the capacitance sensor has two detection mechanisms including a surface type and a projection type. In the surface type, an electrode is formed on one surface of a substrate. In the projection type, electrodes are formed on the two surfaces of the substrate. In this embodiment, the surface type enables the electrode 13c to be formed on the back side of the light guide sheet 13a and therefore eliminates formation of another electrode on the operation surface side of the light guide sheet 13a, which can prevent the electrode from being visually observed during the illumination.

The light guide sheet 13a transmits light in the surface direction thereof and is made from a transparent resin film. The light guide sheet 13a has an evenly smooth surface 1 on the operation surface side. The term "even" refers to evenness without any roughness. The term "smooth" refers to smoothness without any microscopic roughness which can be visually observed, for example, on textured or mat surface. In particular, the smooth surface 1 is preferably a mirror-finished surface or a transferred surface of a mirror-finished roll or mold. The even surface of the light guide sheet 13a can efficiently reflect the light transmitted inside the light guide sheet 13a and can easily transmit the light to a position distant from an incident position of the light in the light guide sheet 13a. The smooth surface of the light guide sheet 13a can suppress the leak of light resulting from the diffuse reflection by the surface. The light guide sheet 13a has a thickness that is preferably in the range from 30 μm to 500 μm. At a thickness below 30 μm, the thin thinness of the light guide sheet decreases the quantity of the light transmitted inside the light guide sheet, which decreases the brightness of the illumination by the sensor-integrated illuminated key sheet. At a thickness over 500 μm, the increase of deforming stress enlarges a pressing load, thereby impairing operability. More preferred thickness is in the range from 100 μm to 300 μm.

Highly transparent thermoplastic resin films are preferably used as the material of the light guide sheet 13a. Examples of such materials include a polyolefin resin film, a vinyl resin film, an acrylic resin film, a polyamide resin film, a polyester resin film, a polycarbonate resin film, a polyurethane resin film, and a polyether resin film. Among these, preferred are a polycarbonate resin film, an acrylic resin film, and a urethane resin film, each not having an area absorptive for wavelengths in a visible light region and having high transparency.

The diffusion layers 13b function to divert a light path to the operation surface and are formed on the back side of the light guide sheet 13a so as to correspond to press operation portions. The diffusion layers 13b are in the form of a resin coating film containing filler and have a rough surface 2 which contacts the light guide sheet 13a. The diffusion layers 13b may have a thickness that is in the range from 5 μm to 30 μm. The diffusion layers 13b may be disposed to illuminate characters and symbols in an intended form or arranged in the manner of dots.

Resins which enable print formation on the light guide sheet 13a are used as the material of the diffusion layers 13b. Examples of the resins include polyolefin resins, vinyl resins, acrylic resins, polyamide resins, polyester resins, polycarbonate resins, polyurethane resins, and polyether resins.

Filler having a high refractive index or optical reflectance may be added. Examples of the filler include titanium oxide. Adjusting the amount of the filler enables brightness to be adjusted. For instance, the filler is added to the diffusion layers 13b near the incident position of light in a reduced amount, and the filler is added to the diffusion layers 13b distant from the incident position of the light in an increased amount, thereby providing totally uniform brightness. Furthermore, the brightness may be adjusted by changing the thickness and pattern of the diffusion layers 13b.

In the print formation of the diffusion layers 13b on the back side of the light guide sheet 13a, a solvent contained in ink preferably serves to form the rough surface 2 which adheres to the light guide sheet 13a. For example, in the case of using a polycarbonate resin film for the light guide sheet 13a, ink containing an aromatic, ketone, or esters solvent can form the rough surface 2 which adheres to the polycarbonate resin film. Instead of applying the ink for the formation of the diffusion layers 13b, the rough surface 2 may be formed as a result of a polish with sandpaper or press by a mold having the shape of the rough surface 2 with application of heat.

The electrode 13c has a rectangular shape slightly smaller than the size of the light guide sheet 13a in plan view and includes a uniform conductive film and position-detecting electrodes formed at the four corners thereof. The electrode 13c is formed on the back side of the light guide sheet 13a so as to cover the diffusion layers 13b.

Conductive polymers, conductive metals, or resins containing conductive metallic oxides can be used as the material of the electrode 13c. Examples of transparent conductive polymers include polythiophenes and polyacetylenes. Examples of the conductive metals include gold, silver, platinum, and nickel. Examples of the conductive metallic oxides include indium tin oxide (ITO), zinc oxide, indium oxide, antimony additive tin oxide, fluoridated tin oxide, aluminum additive zinc oxide, potassium additive zinc oxide, silicone additive zinc oxide, zinc oxide-tin oxide, indium oxide-tin oxide, zinc oxide-indium oxide-magnesium oxide, zinc oxide, and tin oxide films. Examples of the resins containing these conductive metallic oxides include polyester resins, polyurethane resins, polyamide resins, epoxy resins, and acrylic resins.

In the case where the light guide sheet 13a contacts the electrode 13c as in this embodiment, the electrode 13c is preferably made from a material having a refractive index smaller than that of the light guide sheet 13a or a material having a transmittance of 80% or higher. This configuration can prevent the light transmitted inside the light guide sheet 13a from leaking at the interface with the electrode 13c. The transparent conductive polymers are desirable for a material which has high transmittance and enables the electrode to be formed by printing on the light guide sheet 13a. Since translucency is not required for the case in which the electrode 13c is formed on the back side of the light guide sheet 13a as in this embodiment, a conductive ink containing a nontransparent conductive material such as silver or carbon can be used. In order to prevent the oxidization of the electrode 13*c*, resist ink may be applied so as to cover the electrode 13*c*.

The transparent resin layer 13*d* enhances the efficiency of the light guiding of the light guide sheet 13*a*. The transparent resin layer 13*d* is formed on the back side of the light guide sheet 13*a* so as to cover the electrode 13*c* and has substantially the same size as that of the light guide sheet 13*a*. The transparent resin layer 13*d* is a transparent resin coating film formed as a result of applying a non-erosive coating liquid onto the light guide sheet 13*a* and has the evenly smooth surface 1 which contacts the light guide sheet 13*a*.

The transparent resin layer 13*d* may have a thickness that is in the range from 5 μm to 200 μm. At a thickness below 5 μm, the electrode 13*c* may not be certainly covered. At a thickness over 200 μm, the increase of deforming stress enlarges a pressing load, and the sensor-integrated illuminated key sheet 11 come to have increased thickness. More preferred thickness is in the range from 5 μm to 30 μm.

The transparent resin layer 13*d* preferably has a refractive index smaller than that of the light guide sheet 13*a*. At this refractive index of the transparent resin layer 13*d*, which is smaller than that of the light guide sheet 13*a*, the light transmitted in the surface direction of the light guide sheet 13*a* can be totally reflected at the interface therebetween with ease. At the difference in refractive index therebetween by 0.06 or higher, the light can be totally reflected with efficiency. Since the light transmitted in the surface direction of the light guide sheet 13*a* can be totally reflected with ease in this manner, the efficiency of the light guiding increases, thereby being able to further prevent the occurrence of the leak of the light. Since the light-shielding print layer 14 is formed on the back side of the transparent resin layer 13*d*, the decrease in the quantity of light entering the transparent resin layer 13*d* can lead to the decrease in the quantity of light entering the light-shielding print layer 14, thereby reducing light absorption by the light-shielding print layer 14. The decrease of the brightness of the illumination can be accordingly suppressed even though the sensor-integrated illuminated key sheet 11 has the light-shielding print layer 14.

A material to be used for the transparent resin layer 13*d* is a non-erosive coating liquid which has high transparency and does not impart roughness to the surface of the light guide sheet 13*a*. Specific examples of such a material include activation energy line-curable resins such as solventless ultraviolet-curable and EB-curable resins, two-liquid curable resins containing aqueous or alcohol solvents, and thermosetting resins. Examples of coating liquids of these materials include ultraviolet-curable urethane acrylate inks and thermosetting urethane inks. Since the cross-linked or curable ink is used to form the transparent resin layer 13*d*, the transparent resin layer 13*d* becomes less likely to be eroded by the light-shielding print layer 14 or another print layer formed on the transparent resin layer 13*d*.

The light-shielding print layer 14 has dark color such as black and navy, and light is therefore less likely to pass through the light-shielding print layer 14. The light-shielding print layer 14 is a resin coating film formed on the back side of the surface-type capacitance sensor 13 so as to have substantially the same size as that of the surface-type capacitance sensor 13. In particular, the light-shielding print layer 14 is formed on the back side of the transparent resin layer 13*d* so as to have substantially the same size as that of the transparent resin layer 13*d*.

The light-shielding print layer 14 may have a thickness that is in the range from 5 μm to 50 μm. A thickness below 5 μm causes a fear of decreasing a light-shielding effect. A thickness over 50 μm has no influence on the light-shielding effect but causes the increase in the thickness of the sensor-integrated illuminated key sheet 11.

In place of the light-shielding print layer 14, a light-shielding layer formed by another technique may be provided, such as a light-shielding coating layer formed by coating and light-shielding deposited layer formed by deposition.

In order to push contact switches formed on a circuit board (not illustrated) provided to the back side of the sensor-integrated illuminated key sheet 11, the pusher sheet 15 has pushers 15*a* which protrude to the back side so as to correspond to the press operation portions. The pushers 15*a* are integrally connected each other by a base 15*b*, and the base 15*b* is attached to the back surface of the light-shielding print layer 14.

Resins or rubber elastic materials are used as the material of the pusher sheet 15. Examples of the resins include polyurethane resins, polyethylene terephthalate resins, polyethylene naphthalate resins, polyacrylate resins, and polycarbonate resins. Examples of the rubber elastic materials include thermoset elastomers such as silicone rubber and urethane rubber and thermoplastic elastomers such as styrene-based materials and polyester-based materials.

Formation of a light-shielding pusher sheet eliminates the formation of the light-shielding layer.

A method for manufacturing the sensor-integrated illuminated key sheet 11 is hereinafter described.

The surface-type capacitance sensor 13 is produced. A resin film is prepared as the light-guide sheet 13*a*. The diffusion layers 13*b* are formed on one surface (back side) of the resin film by printing. The electrode 13*c* is formed by printing so as to cover the diffusion layers 13*b*. A non-erosive coating liquid is applied so as to cover the electrode 13*c* without imparting roughness to the surface of the light guide sheet 13*a*, thereby forming the transparent resin layer 13*b* by printing. The surface-type capacitance sensor 13 is produced in this manner.

The light-shielding print layer 14 is then formed by printing on the back side of the surface-type capacitance sensor 13. The surface sheet 12 to which a display layer (not illustrated) is provided is subsequently attached to the other side of the surface-type capacitor sensor 13 by a double-sided tape (not illustrated).

The pusher sheet 15, which is separately formed, is finally attached to the back surface of the light-shielding print layer 14, thereby completing the manufacturing of the sensor-integrated key sheet 11.

Effects and advantages of the sensor-integrated illuminated key sheet 11 are hereinafter described.

In the sensor-integrated illuminated key sheet 11, since the light guide sheet 13*a* serves as the substrate of the surface-type capacitance sensor 13, the light guide sheet is provided so as not to separate from the surface-type capacitance sensor 13. The sensor-integrated illuminated key sheet 11 can therefore have totally reduced thickness while the light guide sheet 13*a* serves to secure the brightness of the illumination. Electronic equipment including the sensor-integrated illuminated key sheet 11 can accordingly have a reduced size.

The surface sheet 12 is provided so as to contact the operation surface side of the light guide sheet 13*a* as the substrate of the surface-type capacitance sensor 13. The distance between the operation surface of the surface sheet 12 and the surface-type capacitance sensor 13 can therefore decrease, thereby enhancing the sensitivity and accuracy of the slide input. The sensor-integrated illuminated key sheet 11 which enables an accurate slide input can be provided.

Since the planar surface sheet 12 having a certain thickness serves as the operation section, the distance between the operation surface of the surface sheet 12 and the surface-type capacitance sensor 13 can be maintained constant, thereby being able to stabilize the sensitivity of the surface-type capacitance sensor 13. The surface-type capacitance sensor 13 can therefore have high accuracy for the slide operation on the operation surface, which enables an accurate slide input.

The light-shielding print layer 14 is provided on the back surface of the transparent resin layer 13*d*. In other words, the light-shielding print layer 14 is provided to the back side relative to the light guide sheet 13*a* with the transparent resin layer 13*d* interposed therebetween. Light diffusely reflected between the sensor-integrated illuminated key sheet and the circuit board can be therefore prevented from entering the light guide sheet from the back side of the sensor-integrated illuminated key sheet, thereby enhancing the appearance during the illumination.

Figure 3:
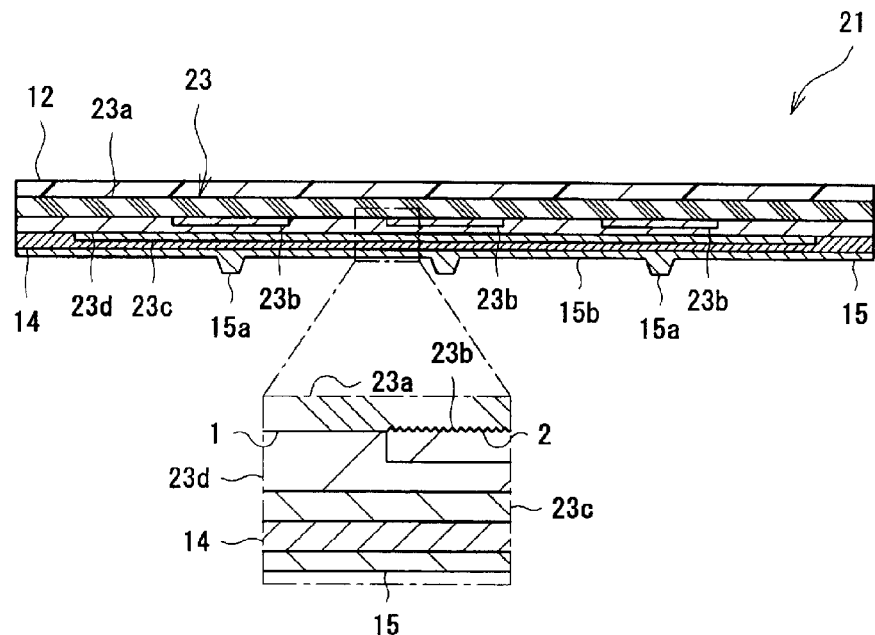
FIG. 3 is a cross-sectional view illustrating a sensor-integrated illuminated key sheet of a second embodiment in the manner of FIG. 2.

Second Embodiment (FIG. 3)

FIG. 3 illustrates a sensor-integrated key sheet 21 of a second embodiment. FIG. 3 is a cross-sectional view illustrating the sensor-integrated illuminated key sheet 21. The sensor-integrated illuminated key sheet 21 of this embodiment differs from the sensor-integrated illuminated key sheet 11 of the first embodiment in the configuration of a surface-type capacitance sensor 23. The other configurations are the same as those of the sensor-integrated illuminated key sheet 11.

The surface-type capacitance sensor 23 serves for position detection in the slide input as in the surface-type capacitance sensor 13 and includes a light guide sheet 23*a* as the substrate, diffusion layers 23*b*, an electrode 23*c*, and a transparent resin layer 23*d*. The difference from the surface-type capacitance sensor 13 lies in the transparent resin layer 23*d* disposed between the light guide sheet 23*a* and the electrode 23*c*. In particular, the transparent resin layer 23*d* is provided on the back surface of the light guide sheet 23*a* so as to cover the diffusion layers 23*b*, and the electrode 23*c* does not contact the light guide sheet 23*a*.

A method for manufacturing the sensor-integrated key sheet 21 is hereinafter described. The diffusion layers 23*b* are formed by printing on one surface (back side) of a resin film as the light guide sheet 23*a*. The transparent resin layer 23*b* is formed by printing so as to cover the diffusion layers 23*b*. The electrode 23*c* is formed by printing on the back surface of the transparent resin layer 23*b*. The surface-type capacitance sensor 23 is produced in this manner. The light-shielding print layer 14 is then formed by printing on the back surface of the surface-type capacitance sensor 23, and the surface sheet 12 is subsequently attached to the other surface of the surface-type capacitance sensor 23. The pusher sheet 15 is finally attached to the back surface of the light-shielding print layer 14, thereby completing the manufacturing of the sensor-integrated key sheet 21.

The sensor-integrated illuminated key sheet 21 has a configuration in which the transparent resin film 23*d* is disposed between the light guide sheet 23*a* and the electrode 23*c*. Thus, even though the diffusion layers 23*c* are formed partially on the back surface of the light guide sheet 23*a* with the result that the back surface of the light guide sheet 23*a* has unevenness, the transparent resin layer 23*d* uniformly covers the unevenness, thereby being able to form the electrode 23*c* on an even surface. Electrostatic capacity can be therefore accurately detected, which enables a highly accurate slide input.

The transparent resin layer 23*d* made from a resin having a refractive index smaller than that of the light guide sheet 23*a* can enhance the efficiency of light reflection at the interface between the light guide sheet 23*a* and the transparent resin layer 23*d*, which can prevent the light transmitted inside the light guide sheet 23*a* from entering the transparent resin layer 23*d*. The light can be consequently prevented from leaking to the outside of the light guide sheet 23*a*, thereby being able to increase the efficiency of the light guiding of the light guide sheet 23*a*.

Since the light guide sheet 23*a* and the transparent resin layer 23*d* have the smooth surfaces 1 which contact each other, light can be prevented from diffusing at the interfaces between the light guide sheet 23*a* and the transparent resin layers 23*d*, leading to efficient reflection of the light, which has been transmitted inside the light guide sheet 23*a*, to the inside of the light guide sheet 23*a*. The light transmitted inside the light guide sheet 23*a* can be therefore prevented from entering the transparent resin layers 23*d* and leaking to the outside of the light guide sheet 23*a*.

Figure 4:
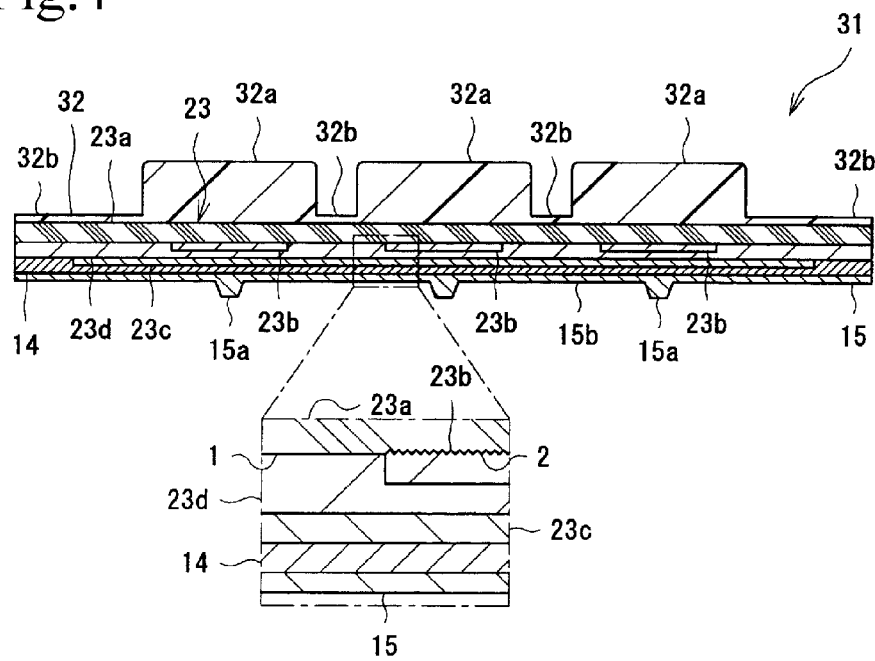
FIG. 4 is a cross-sectional view illustrating a sensor-integrated illuminated key sheet of a third embodiment in the manner of FIG. 2.

Third Embodiment (FIG. 4)

FIG. 4 illustrates a sensor-integrated key sheet 31 of a third embodiment. FIG. 4 is a cross-sectional view illustrating the sensor-integrated illuminated key sheet 31. The sensor-integrated illuminated key sheet 31 of this embodiment differs from the sensor-integrated illuminated key sheet 21 of the second embodiment in that a cover 32 as the "operation section" is provided in place of the surface sheet 12. The other configurations are the same as those of the sensor-integrated illuminated key sheet 21.

As in the surface sheet 12, the cover 32 forms the operation surface side of the sensor-integrated illuminated key sheet 31 and is attached so as to cover the entire surface of the surface-type capacitance sensor 23. The difference from the surface sheet 12 lies in that block-shaped key tops 32*a* function as the press operation portions, the block-shaped key tops 32*a* extending toward the operation surface side. The individual key tops 32*a* are integrally connected each other by a base 32*b*.

Various types of resins can be used as the material of the cover 32. Ultraviolet curable resins enable the cover 32 to be easily formed and are therefore preferably employed. The ultraviolet curable resins enable the cover 32 to be attached to the light guide sheet 23*a* at the same time as the formation thereof. The key tops preferably have a thickness that is in the range from 0.2 mm to 0.6 mm. The thin thickness of the key tops 32*a* provides a small distance between the operation surface as the upper surface of the key tops 32*a* and the surface-type capacitance sensor 23, thereby being able to increase sensitivity. A thickness below 0.2 mm causes cracks in the press operation. The uniform thickness of the key tops 32*a* provides constant distance between the operation surface of the key tops 32*a* and the surface-type capacitance sensor 23, thereby being able to prevent the occurrence of false recognition.

A method for manufacturing the sensor-integrated illuminated key sheet 31 is hereinafter described. As in the case of the sensor-integrated illuminated key sheet 21, the surface-type capacitance sensor 23 is produced. The light-shielding print layer 14 is then formed by printing on the back surface of the surface-type capacitance sensor 23. A display layer (not illustrated) is subsequently formed on the other surface of the surface-type capacitance sensor 23, and the cover 32 is formed and attached. The pusher sheet 15 is finally attached to the back surface of the light-shielding print layer 14, thereby completing the manufacturing of the sensor-integrated key sheet 31.

In the sensor-integrated illuminated key sheet 31, since the cover 32 has the block-shaped key tops 32*a*, positions to be pressed can be clearly recognized by visual observation and touch, which enables easy pressing input.

Figure 5:
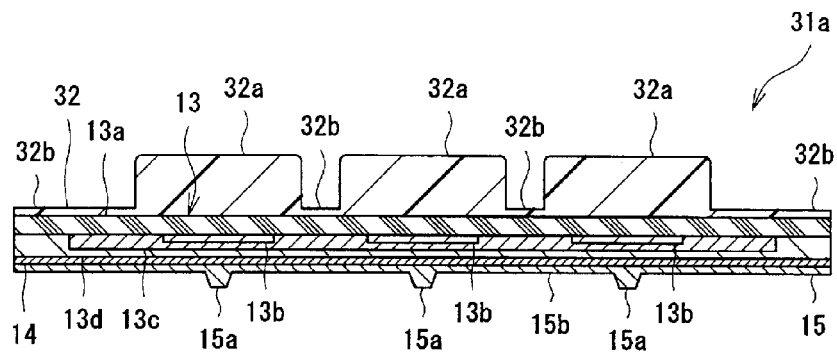
FIG. 5 is a cross-sectional view illustrating a modification of the sensor-integrated illuminated key sheet of the third embodiment in the manner of FIG. 2.

Modification of Third Embodiment (FIG. 5)

Although the sensor-integrated illuminated key sheet 31 of the third embodiment has the surface-type capacitance sensor 23, a sensor-integrated illuminated key sheet 31*a* as a modification may have a surface-type capacitance sensor 13.

This configuration also eliminates formation of the light guide sheet separating from the surface-type capacitance sensor 13, thereby being able to reduce the entire thickness of the sensor-integrated illuminated key sheet 31*a* while the light guide sheet 13*a* serves to secure the brightness of the illumination.

Figure 6:
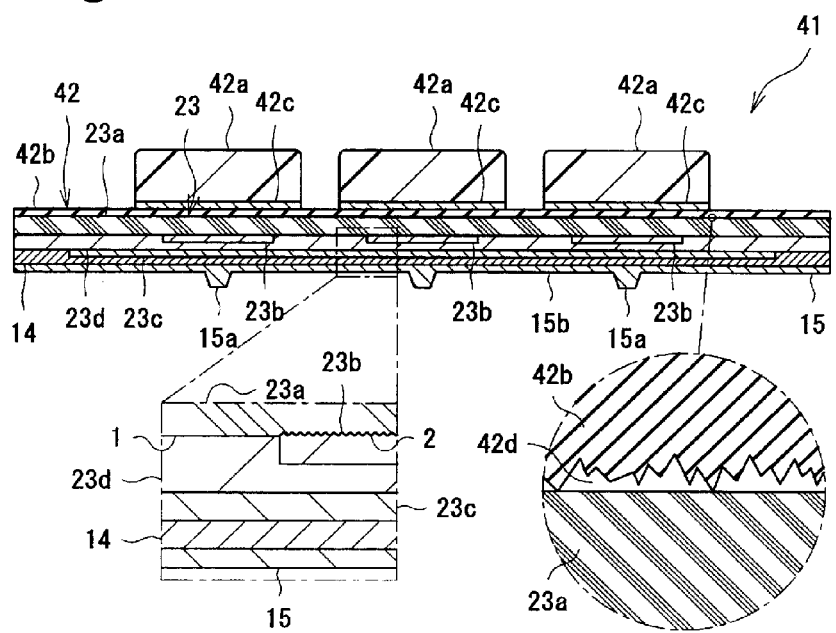
FIG. 6 is a cross-sectional view illustrating a sensor-integrated illuminated key sheet of a fourth embodiment in the manner of FIG. 2.

Fourth Embodiment (FIG. 6)

FIG. 6 illustrates a sensor-integrated illuminated key sheet 41 of a fourth embodiment. FIG. 6 is a cross-sectional view illustrating the sensor-illuminated key sheet 41. The sensor-integrated illuminated key sheet 41 of this embodiment differs from the sensor-integrate illuminated key sheet 31 of the third embodiment in the configuration of a cover sheet 42 as the "operation section". The other configurations are the same as those of the sensor-integrated illuminated key sheet 31.

The cover 42 forms the operation surface side of the sensor-integrated illuminated key sheet 41 as in the case of the cover 32 and is disposed so as to contact and cover the entire surface of the surface-type capacitance sensor 23 without being attached. The difference from the cover 32 lies in that block-shaped key tops 42*a* as the press operation portions are formed separately from a cover sheet 42*b* which connects the individual key tops 42*a* and that an adhesive layer 42*c* combines the individual members. The cover sheet 42*b* has the back surface formed as a blasted surface. The back surface of the cover sheet 42*b* contacts the surface of the light guide sheet 23*a* of the surface-type capacitance sensor 23, and the blasted surface of the cover sheet 42*b* serves to form micron-sized fine space 42*d* therebetween.

Thermoplastic resins and reaction curable resins having high transparency are used as the material of the key tops 42*a*. Examples of such resins include polyolefin resins, vinyl resins, acrylic resins, polyamide resins, polyester resins, polycarbonate resins, polyurethane resins, polyether resins, epoxy resins, silicone resins, and alkyd resins. Among these, in terms of processability and strength, preferred are acrylic resins, polycarbonate resins, polyurethane resins, epoxy resins, and silicone resins. The key tops preferably have a thickness that is in the range from 0.2 mm to 0.6 mm.

Examples of the material used for the cover sheet 42*b* include resin films such as a polyethylene terephthalate film, a polybutylene terephthalate film, a polyurethane film, a polyamide film, a polypropylene film, a polystyrene film, a fluorine film, an ionomer film, a polycarbonate film, and a polyvinyl chloride film. Furthermore, the cover sheet 42*b* may additionally include a colored layer and a light guide layer. In view of reduction in the thickness, the cover sheet 42*b* has a thickness of preferably 150 µm or smaller, and more preferably 50 µm or smaller.

The material used for the adhesive layer 42*c* includes various types of adhesives which serve to attach the key tops 42*a* to the cover sheet 42*b* and has translucency. The adhesives preferably have transparency. Examples of such adhesives include ultraviolet curable resins and hot-melt resins.

A method for manufacturing the sensor-integrated illuminated key sheet 41 is hereinafter described. As in the sensor-integrated illuminated key sheet 31, the surface-type capacitance sensor 23 is produced. The light-shielding print layer 14 is then formed by printing on the back surface of the surface-type capacitance sensor 23. The pusher sheet 15 is subsequently attached to the back surface of the light-shielding print layer 14. The key tops 42*a* having a display layer (not illustrated) are attached to the cover sheet 42*b* through the adhesive layer 42*c* to form the cover 42, and the cover 42 is finally disposed so as to contact the other surface of the surface-type capacitance sensor 23, thereby completing the manufacturing of the sensor-integrated illuminated key sheet 41.

In the sensor-integrated illuminated key sheet 41, since the cover 42 includes the key tops 42*a* and the cover sheet 42*b*, the cover sheet 42*b* can cover the operation surface side of the surface-type capacitance sensor 23, thereby being able to prevent the operation surface side of the surface-type capacitance sensor 23 from being damaged. The surface-type capacitance sensor 23 can therefore have stable sensitivity, which can enhance the accuracy of the slide input. Since the cover sheet 42*b* on which the key tops 42*a* has been provided overlies and contacts the operation surface side of the light guide sheet 23*a* of the surface-type capacitance sensor 23, the distance between the operation surface as the upper surface of the key tops 42*a* and the surface-type capacitance sensor 23 can decrease, thereby being able to enhance the sensitivity and accuracy of the slide input. The sensor-integrated illuminated key sheet 41 which enables an accurate slide input can be therefore provided.

The blasted surface of the cover sheet 42*b* which overlies and contacts the light guide sheet 23*a* of the surface-type capacitance sensor 23 can form the micron-sized fine space 42*d* to the operation surface side of the light guide sheet 23*a*. Since the space 42*d* has a refractive index smaller than that of the light guide sheet 23*a*, the light transmitted inside the light guide sheet 23*a* can be easily reflected by the surface which faces the space 42*d*, thereby being able to prevent the leak of the light from the surface to the outside. The efficiency of the light guiding of the light guide sheet 23*a* can be therefore enhanced, which leads to bright illumination.

Figure 7:
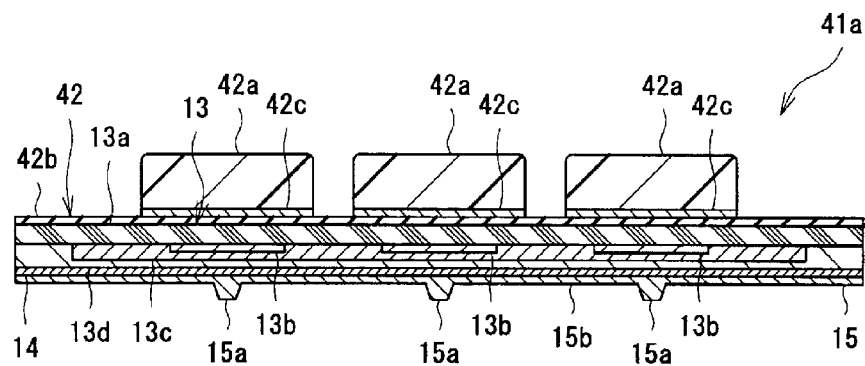
FIG. 7 is a cross-sectional view illustrating a modification of the sensor-integrated illuminated key sheet of the fourth embodiment in the manner of FIG. 2.

Modification of Fourth Embodiment (FIG. 7)

Although the sensor-integrated illuminated key sheet 41 of the fourth embodiment has the surface-type capacitance sensor 23, a sensor-integrated illuminated key sheet 41*a* as a modification may have the surface-type capacitance sensor 13.

This configuration also eliminates formation of the light guide sheet separating from the surface-type capacitance sensor 13, thereby being able to reduce the entire thickness of the sensor-integrated illuminated key sheet 41*a* while the light guide sheet 13*a* serves to secure the brightness of the illumination.

Figure 8:
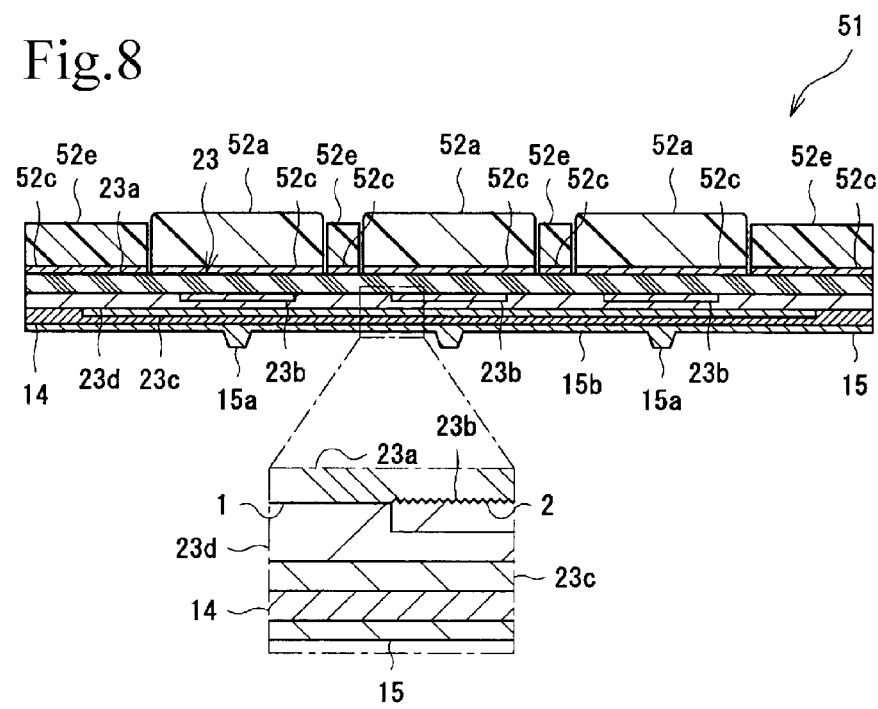
FIG. 8 is a cross-sectional view illustrating a sensor-integrated illuminated key sheet of a fifth embodiment in the manner of FIG. 2.

Fifth Embodiment (FIG. 8)

FIG. 8 illustrates a sensor-integrated illuminated key sheet 51 of a fifth embodiment. FIG. 8 is a cross-sectional view illustrating the sensor-integrated illuminated key sheet 51. The sensor-integrated illuminated key sheet 51 of this embodiment differs from the sensor-integrated illuminated key sheet 31 of the third embodiment in that the sensor-integrated illuminated key sheet 51 includes key tops 52*a* as the "operation section" and a frame sheet 52*e* without the cover 32. The other configurations are the same as those of the sensor-integrated illuminated key sheet 31.

As in the case of the key tops 42*a* of the cover 42, the key tops 52*a* function as the press operation portions formed in a block shape and are attached to the operation surface side of the surface-type capacitance sensor 23 through an adhesive layer 52*c*.

The frame sheet 52*e* fills the gap between the individual key tops 52*a* so as to surround the periphery of the group of the key tops 52a and is attached to the operation surface side of the surface-type capacitance sensor 23 through the adhesive layer 52c.

Resin films which enable formation of a print layer or deposited layer are used as the material of the frame sheet 52e. Examples of the resin films include a polyethylene terephthalate film, a polybutylene terephthalate film, a polyurethane film, a polyamide film, a polypropylene film, a polystyrene film, a fluorine film, an ionomer film, a polycarbonate film, and a polyvinyl chloride film. The frame sheet 52e preferably has a thickness that is slightly smaller than that of the individual key tops 52a, in particular, approximately from 0.2 mm to 0.5 mm. The material used for the frame sheet 52e preferably has the same dielectric constant as that of the material used for the key tops 52a. Use of the same material for the frame sheet 52e and the key tops 52a can provide the same dielectric constant.

A method for manufacturing the sensor-integrated illuminated key sheet 51 is hereinafter described. As in the sensor-integrated illuminated key sheet 31, the surface-type capacitance sensor 23 is produced. The light-shielding print layer 14 is then formed on the back surface of the surface-type capacitance sensor 23, and the pusher sheet 15 is subsequently attached to the back surface of the light-shielding print layer 14. The key tops 52a, having a display layer (not illustrate), and the frame sheet 52e are finally individually attached to the other surface of the surface-type capacitance sensor 23 through the adhesive layer 52c, thereby completing the manufacturing of the sensor-integrated key sheet 51.

In the sensor-integrated illuminated key sheet 51, since the operation section includes the key tops 52a and the frame sheet 52e, the frame sheet 52e can fill the gap between the individual key tops 52a. Even though the gap between the individual key tops 52a increases, the upper surface of the key tops 52a and the upper surface of the frame sheet 52e can form a slide operation surface. Thus, roughness can be less likely to be formed on the slide operation surface, and the distance between the slide operation surface and the surface-type capacitance sensor 23 can be maintained substantially constant. The surface-type capacitance sensor 23 can accordingly have stable sensitivity, thereby being able to enhance the accuracy of the slide input. The increase in the gap between the individual key tops 52a by the frame sheet 52e can prevent the adjacent key tops 52a from working together in the pressing input, which can prevent the occurrence of wrong input in the pressing input.

Use of materials having the same dielectric constant for the key tops 52a and the frame sheet 52e can enhance the accuracy of the surface-type capacitance sensor 23, thereby being able to prevent the occurrence of malfunction.

Figure 9:
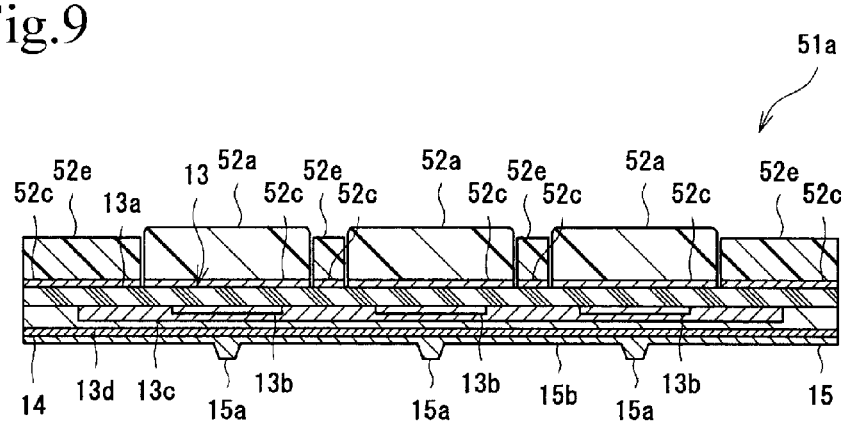
FIG. 9 is a cross-sectional view illustrating a modification of the sensor-integrated illuminated key sheet of the fifth embodiment in the manner of FIG. 2.

Modification of Fifth Embodiment (FIG. 9)

Although the sensor-integrated illuminated key sheet 51 of the fifth embodiment has the surface-type capacitance sensor 23, a sensor-integrated illuminated key sheet 51a as a modification may have the surface-type capacitance sensor 13.

This configuration also eliminates formation of the light guide sheet separating from the surface-type capacitance sensor 13, thereby being able to reduce the entire thickness of the sensor-integrated illuminated key sheet 51a while the light guide sheet 13a serves to secure the brightness of the illumination.

Figure 10:
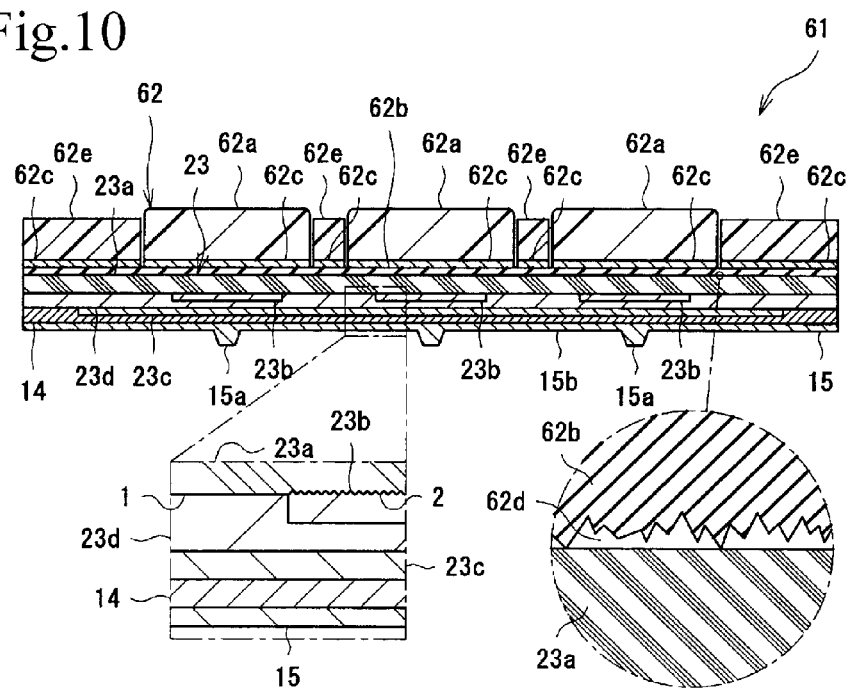
FIG. 10 is a cross-sectional view illustrating a sensor-integrated illuminated key sheet of a sixth embodiment in the manner of FIG. 2.

Sixth Embodiment (FIG. 10)

FIG. 10 illustrates a sensor-integrated illuminated key sheet 61 of a sixth embodiment. FIG. 10 is a cross-sectional view illustrating the sensor-integrated illuminated key sheet 61. The sensor-integrated illuminated key sheet 61 of this embodiment differs from the sensor-integrated illuminated key sheet 51 of the fifth embodiment in that the sensor-integrated illuminated key sheet 61 has a cover sheet 62 as the "operation portion" without the key tops 52a and the frame sheet 52e. The other configurations are the same as those of the sensor-integrated illuminated key sheet 51.

The cover 62 forms the operation surface of the sensor-integrated illuminated key sheet 61 and contacts the surface-type capacitance sensor 23 without being attached so as to cover the entire surface thereof. The cover sheet 62 includes key tops 62a and frame sheet 62e each attached to a cover sheet 62b through an adhesive layer 62c. The key tops 62a function as the press operation portions formed in a block shape. The frame sheet 62e fills the gap between the individual key tops 62a so as to surround the periphery of the group of the key tops 62a. The cover sheet 62b has the back surface exposed to blasting. The back surface of the cover sheet 62b contacts the surface of the light guide sheet 23a of the surface-type capacitance sensor 23, and the blasted surface of the cover sheet 62b serves to form micron-sized fine space 62d therebetween.

A method for manufacturing the sensor-integrated illuminated key sheet 61 is hereinafter described. As in the case of the sensor-integrated illuminated key sheet 51, the surface-type capacitance sensor 23 is produced. The light-shielding print layer 14 is formed by printing on the back surface of the surface-type capacitance sensor 23. The pusher sheet 15 is subsequently attached to the back surface of the light-shielding print layer 14. The key tops 62a and frame sheet 62e each having a display layer (not illustrated) are attached to the cover sheet 62b through the adhesive layer 62c to form the cover 62, and the cover 62 are finally disposed so as to contact the other surface of the surface-type capacitance sensor 23, thereby completing the manufacturing of the sensor-integrated key sheet 61.

Since the sensor-integrated illuminate key sheet 61 has the cover sheet 62b, the cover sheet 62b can cover the operation surface side of the surface-type capacitance sensor 23, thereby being able to prevent the light guide sheet 23a of the surface-type capacitance sensor 23 from being damaged. The surface-type capacitance sensor 23 can therefore have stable sensitivity, which can enhance the accuracy of the slide input. Since the cover sheet 62b to which the key tops 62a and frame sheet 62e have been attached overlies and contacts the operation surface side of the light guide sheet 23a of the surface-type capacitance sensor 23, the distance between the operation surface, as the upper surfaces of the key tops 62a and the frame sheet 62e, and the surface-type capacitance sensor 23 can decrease, thereby being able to enhance the sensitivity and accuracy of the slide input. The sensor-integrated illuminated key sheet 61 which enables an accurate slide input can be accordingly provided.

The blasted surface of the cover sheet 62b which overlies and contacts the light guide sheet 23a of the surface-type capacitance sensor 23 can form the micron-sized fine space 62d to the operation surface side of the light guide sheet 23a. Since the space 62d has a refractive index smaller than that of the light guide sheet 23a, the light transmitted inside the light guide sheet 23a can be easily reflected by the surface which faces the space 62d, thereby being able to prevent the leak of the light from the surface to the outside. The efficiency of the light guiding of the light guide sheet 23a can be therefore enhanced, which leads to bright illumination.

Figure 11:
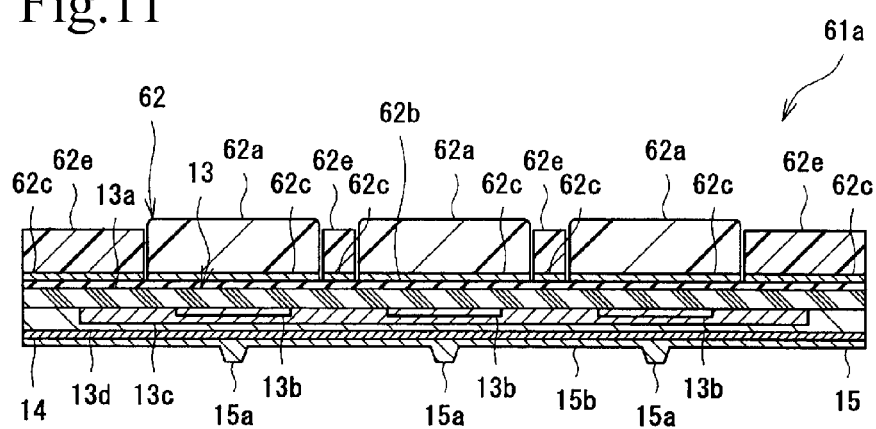
FIG. 11 is a cross-sectional view illustrating a modification of the sensor-integrated illuminated key sheet of the sixth embodiment in the manner of FIG. 2.

Modification of Sixth Embodiment (FIG. 11)

Although the sensor-integrated illuminated key sheet 61 of the sixth embodiment has the surface-type capacitance sensor 23, a sensor-integrated illuminated key sheet 61a as a modification may have the surface-type capacitance sensor 13.

This configuration also eliminates formation of the light guide sheet separating from the surface-type capacitance sensor 13, thereby being able to reduce the entire thickness of the sensor-integrated illuminated key sheet 61a while the light guide sheet 13a serves to secure the brightness of the illumination.

Figure 12:
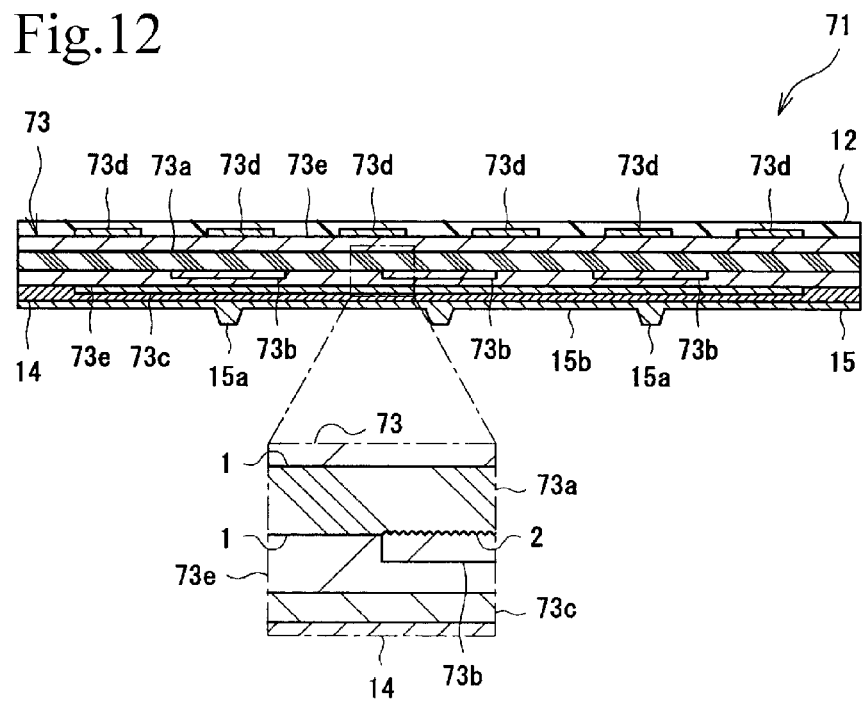
FIG. 12 is a cross-sectional view illustrating a sensor-integrated illuminated key sheet of a seventh embodiment in the manner of FIG. 2.

Seventh Embodiment (FIG. 12)

FIG. 12 illustrates a sensor-integrated illuminated key sheet 71 of a seventh embodiment. FIG. 12 is a cross-sectional view illustrating the sensor-integrated illuminated key sheet 71. The sensor-integrated illuminated key sheet 71 of this embodiment differs from the sensor-integrated illuminated key sheet 21 of the second embodiment in that the sensor-integrated illuminated key sheet 71 includes a projection-type capacitance sensor 73 in place of the surface-type capacitance sensor 23. The other configurations are the same as those of the sensor-integrated illuminated capacitance sensor 21.

The projection-type capacitance sensor 73 serves for position detection in the slide input and includes a light guide sheet 73a as the substrate, diffusion layers 73b, a first electrode 73c, second electrodes 73d, and transparent resin layers 73e. The projection-type capacitance sensor 73 enables multipoint detection as in this embodiment, which can impart variation to the slide input. However, in the case of position detection only in any one of X-coordinates and Y-coordinates, any one of the electrodes may be formed.

As in the light guide sheet 23a, the light guide sheet 73a transmits light in the surface direction thereof and is made from a transparent resin film. The light guide sheet 73a has the evenly smooth surface 1 on the operation surface side.

As in the diffusion layers 23b, the diffusion layers 73b function to divert a light path to the operation surface side and are formed on the back surface of the light guide sheet 73a so as to correspond to the press operation portions.

The first electrode 73c detects positions in any one of the X-coordinates and the Y-coordinates and is formed on the transparent resin layers 73e provided on the back surface of the light guide sheet 73a. In other words, the first electrode 73c does not contact the light guide sheet 73a. A plurality of conductive layers extending in parallel form the first electrode 73c.

The second electrodes 73d detect positions in the other one of the X-coordinates and the Y-coordinates and are formed on the transparent resin layer 73e provided on the other surface of the light guide sheet 73a. In other words, the second electrodes 73d also do not contact the light guide sheet 73a. A plurality of conductive layers extending in parallel also form the second electrodes 73d, and the direction of this extension vertically intersects the direction of the extension in the first electrode 73c.

As in the transparent resin layer 23d, the transparent resin layers 73e enhance the efficiency of the light guiding of the light guide sheet 73a. One of the transparent resin layers 73e is formed on the back surface of the light guide sheet 73a with the size substantially the same as that of the light guide sheet 73a so as to cover the diffusion layers 73b. The other one of the transparent resin films 73e is formed on the other surface of the light guide sheet 73a so as to have the size substantially the same as that of the light guide sheet 73a. The transparent resin layers 73e are transparent resin coating layers formed as a result of applying a non-erosive coating liquid to the light guide sheet 73a and each have the evenly smooth surface 1 which contacts the light guide sheet 73a.

A method for manufacturing the sensor-integrated illuminated key sheet 71 is hereinafter described. The diffusion layers 73b are formed by printing on one surface (back side) of a resin film as the light guide sheet 73a. The transparent resin layer 73e is formed by printing so as to cover the diffusion layers 73b, and the first electrode 73c is formed by printing on the back surface of this transparent resin layer 73e. The transparent resin layer 73e is additionally formed by printing so as to cover the other surface of the resin film, and the second electrodes 73d are formed by printing on the surface of this transparent resin layer 73e. The projection-type capacitance sensor 73 is produced in this manner. The light-shielding print layer 14 is then formed by printing on the back surface of the projection-type capacitance sensor 73, and the surface sheet 12 is subsequently attached to the other surface of the projection-type capacitance sensor 73. The pusher sheet 15 is finally attached to the back surface of the light-shielding print layer 14, thereby completing the manufacturing of the sensor-integrated key sheet 71.

The sensor-integrated illuminated key sheet 71 eliminates formation of the light guide sheet separating from the projection-type capacitance sensor 73, which can reduce the entire thickness of the sensor-integrated illuminated key sheet 71 while the light guide sheet 73a secures the brightness of the illumination. Electronic equipment including the sensor-integrated illuminated key sheet 71 can therefore have a reduced size. In addition, the sensor-integrated illuminated key sheet 71 includes the reduced number of components and can be thus produced through simple processes.

Since the surface sheet 12 contacts the operation surface side of the light guide sheet 73a, the distance between the operation surface of the surface sheet 12 and the projection-type capacitance sensor 73 can decrease, thereby being able to enhance the sensitivity and accuracy of the slide input. The sensor-integrated illuminated key sheet 71 which enables an accurate slide input can be accordingly provided.

The first electrode 73c is formed on the transparent resin film 73e provided on the light guide sheet 73a. Thus, even though the diffusion layers 73c are formed partially on the back surface of the light guide sheet 73a with the result that the back surface of the light guide sheet 73a has unevenness, the transparent resin layer 73e uniformly covers the unevenness, thereby being able to form the first electrode 73c on an even surface. Electrostatic capacity can be therefore accurately detected, leading to a highly accurate slide input.

The transparent resin layers 73e made from a resin having a refractive index smaller than that of the light guide sheet 73a can enhance the efficiency of light reflection at the interfaces between the light guide sheet 73a and the transparent resin layers 73e, which can prevent the light transmitted inside the light guide sheet 73a from entering the transparent resin layers 73e. The light can be accordingly prevented from leaking to the outside of the light guide sheet 73a, which can increase the efficiency of the light guiding of the light guide sheet 73a.

Since the light guide sheet 73a and the transparent resin layers 73e have the smooth surfaces 1 which contact each other, light can be prevented from diffusing at the interfaces between the light guide sheet 73a and the transparent resin layers 73e, leading to efficient reflection of the light, which has been transmitted inside the light guide sheet 73a, to the inside of the light guide sheet 73a. The light transmitted inside the light guide sheet 73a can be therefore prevented from entering the transparent resin layers 73e and leaking to the outside of the light guide sheet 73a.

Figure 13:
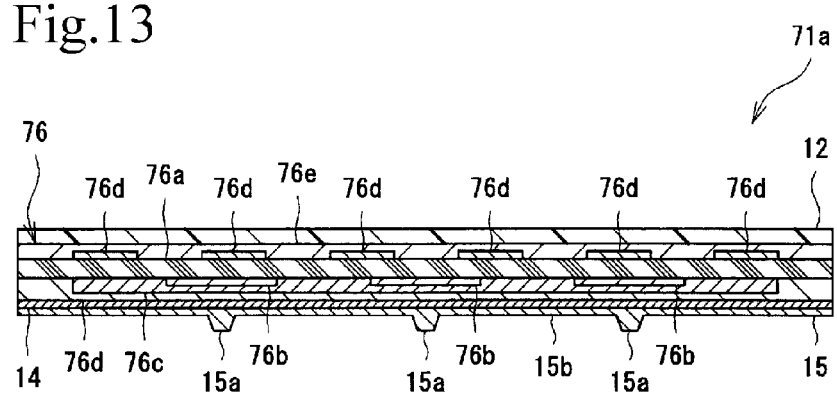
FIG. 13 is a cross-sectional view illustrating a first modification of the sensor-integrated illuminated key sheet of the seventh embodiment in the manner of FIG. 2.

First Modification of Seventh Embodiment (FIG. 13)

Although the sensor-integrated illuminated key sheet 71 of the seventh embodiment has the projection-type capacitance sensor 73, a sensor-integrated illuminated key sheet 71a as a first modification may have a projection-type capacitance sensor 76.

In the projection-type capacitance sensor 76, a first electrode 76c is formed on the back surface of a light guide sheet 76a as the substrate so as to cover diffusion layers 76b, and a transparent resin layer 76e having a size substantially the same as that of the light guide sheet 76a is formed on the back surface of the light guide sheet 76a so as to cover the first electrode 76c. Second electrodes 76d are formed on the other surface of the light guide sheet 76a, and the other transparent resin layer 76e having a size substantially the same as that of the light guide sheet 76a is formed on this surface of the light guide sheet 76a so as to cover the second electrodes 76d. In other words, the first electrode 76c and the second electrodes 76d contact the light guide sheet 76a.

This configuration also eliminates formation of the light guide sheet separating from the projection-type capacitance sensor 76, which can reduce the entire thickness of the sensor-integrated illuminated key sheet 71a while the light guide sheet 76a serves to secure the brightness of the illumination.

Figure 14:
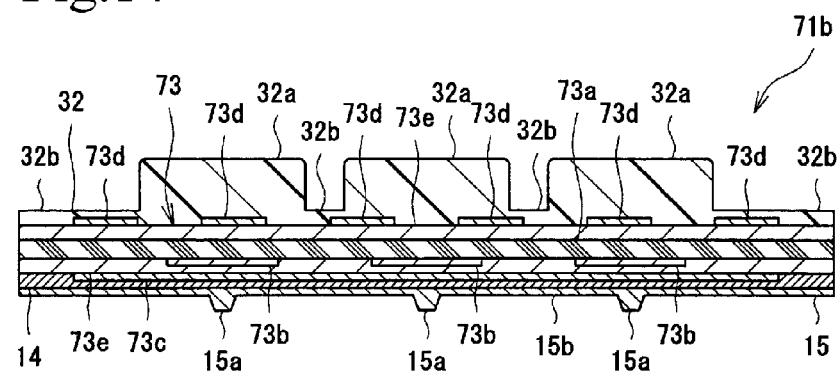
FIG. 14 is a cross-sectional view illustrating a second modification of the sensor-integrated illuminated key sheet of the seventh embodiment in the manner of FIG. 2.

Second Modification of Seventh Embodiment (FIG. 14)

Although the sensor-integrated illuminated key sheet 71 of the seventh embodiment has the surface sheet 12, a sensor-integrated illuminated key sheet 71b as a second modification may have the cover 32.

Also in this configuration, since the cover 32 has the block-shaped key tops 32a, positions to be pushed can be clearly recognized by visual observation and touch, which enables easy pressing input. The sensor-integrated illuminated key sheet 71b may also include the projection-type capacitance sensor 76 in place of the projection-type capacitance sensor 73.

Figure 15:
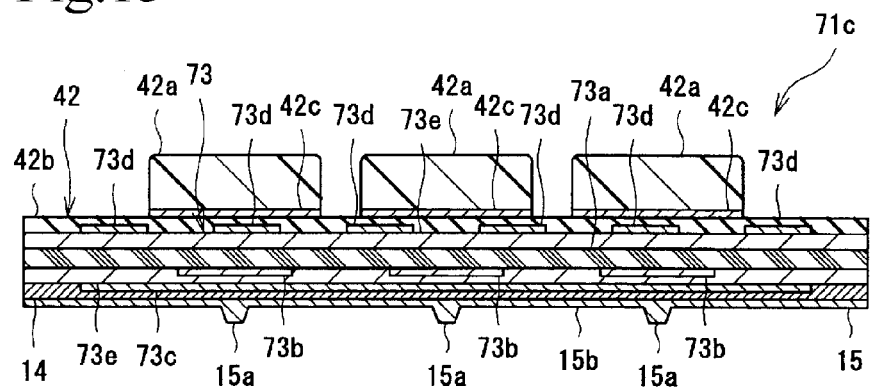
FIG. 15 is a cross-sectional view illustrating a third modification of the sensor-integrated illuminated key sheet of the seventh embodiment in the manner of FIG. 2.

Third Modification of Seventh Embodiment (FIG. 15)

Although the sensor-integrated illuminated key sheet 71 of the seventh embodiment has the surface sheet 12, a sensor-integrated illuminated key sheet 71c as a third modification may have the cover 42.

Also in this configuration, the cover sheet 42b can cover the operation surface side of the projection-type capacitance sensor 73, thereby being able to prevent damage of the operation surface side of the projection-type capacitance sensor 73. In addition, the distance between the operation surface as the upper surface of the key tops 42a and the projection-type capacitance sensor 73 can decrease, which can enhance the sensitivity and accuracy of the slide input. Furthermore, the micron-sized fine space 42d can be formed to the operation surface side of the light guide sheet 23a. The light transmitted inside the light guide sheet 23a can be easily reflected by the surface which faces the space 42d, thereby being able to prevent the leak of the light from the surface to the outside. The sensor-integrated illuminated key sheet 71c may also include the projection-type capacitance sensor 76 in place of the projection-type capacitance sensor 73.

Figure 16:
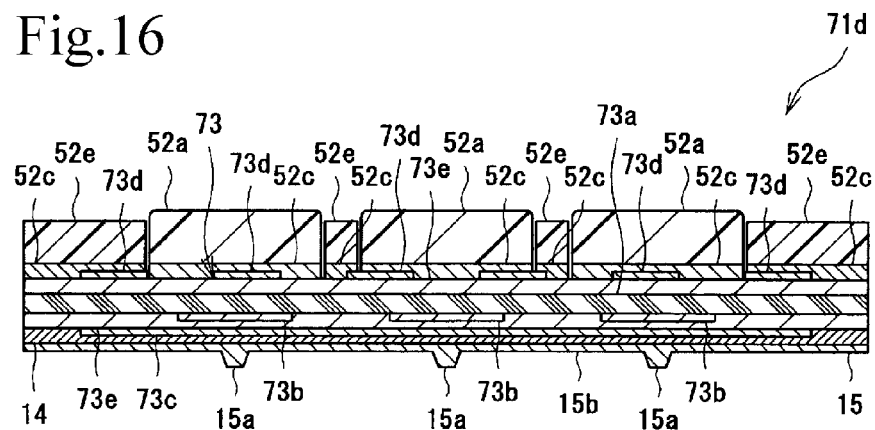
FIG. 16 is a cross-sectional view illustrating a fourth modification of the sensor-integrated illuminated key sheet of the seventh embodiment in the manner of FIG. 2.

Fourth Modification of Seventh Embodiment (FIG. 16)

Although the sensor-integrated illuminated key sheet 71 of the seventh embodiment has the surface sheet 12, a sensor-integrated illuminated key sheet 71d as a fourth modification may have the key tops 52a and the frame sheet 52e.

Also in this configuration, the upper surface of the key tops 52a and the upper surface of the frame sheet 52e can form the slide operation surface. Thus, roughness can be less likely to be formed on the slide operation surface, and the distance between the slide operation surface and the projection-type capacitance sensor 73 can be maintained substantially constant. Use of materials having the same dielectric constant for the key tops 52a and the frame sheet 52e can enhance the accuracy of the projection-type capacitance sensor 73, thereby being able to prevent the occurrence of malfunction. The sensor-integrated illuminated key sheet 71d may also include the projection-type capacitance sensor 76 in place of the projection-type capacitance sensor 73.

Figure 17:
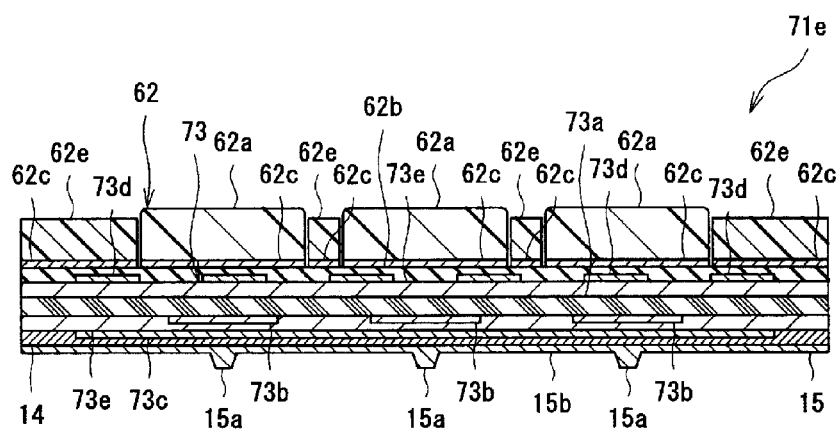
FIG. 17 is a cross-sectional view illustrating a fifth modification of the sensor-integrated illuminated key sheet of the seventh embodiment in the manner of FIG. 2.
Figure 18:
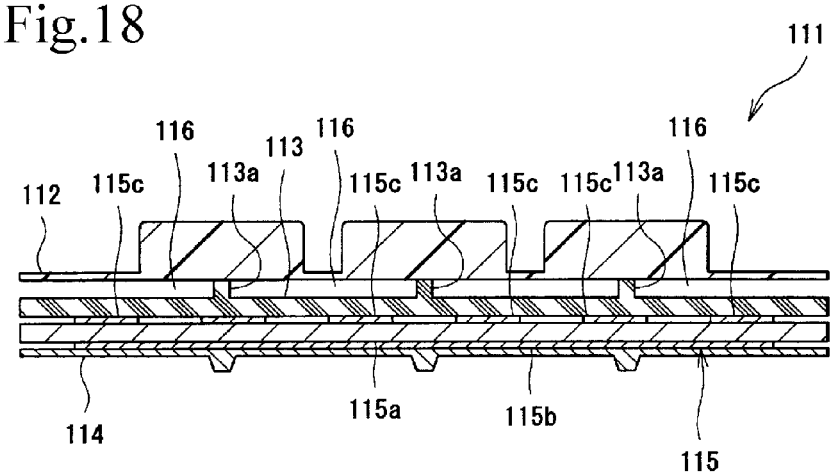
FIG. 18 is a cross-sectional view illustrating a traditional sensor-integrated illuminated key sheet.

Fifth Modification of Seventh Embodiment (FIG. 17)

Although the sensor-integrated illuminated key sheet 71 of the seventh embodiment has the surface sheet 12, a sensor-integrated illuminated key sheet 71e as a fifth modification may have the cover 62.

Also in this configuration, the cover sheet 62b can cover the operation surface side of the projection-type capacitance sensor 73, thereby being able to prevent damage of the transparent resin layer 73e of the projection-type capacitance sensor 73. In addition, the distance between the operation surface as the upper surfaces of the key tops 62a and frame sheet 62e and the projection-type capacitance sensor 73 can decrease, which can enhance the sensitivity and accuracy of the slide input. The sensor-integrated illuminated key sheet 71e may also include the projection-type capacitance sensor 76 in place of the projection-type capacitance sensor 73.

Modifications Common to Embodiments

Modifications hereinafter described are common to the sensor-integrated illuminated key sheets 11, 21, 31, 41, 51, 61, and 71 and the modifications thereof in the embodiments.

A first common modification can eliminate use of the light-shielding print layer 14. This configuration excludes light absorption by the light-shielding print layer 14 and therefore also eliminates use of the transparent resin layer provided to the back side of the light guide sheet in each of the embodiments, which can reduce the thickness of the sensor-integrated illuminated key sheet.

A second common modification can include a pusher made from hard resins in place of the pusher sheet 15. In this case, ultraviolet curable resins are easily processed and are therefore preferably used for the pusher. This configuration can prevent the pusher from absorbing impact and can accurately give the tactile feel of the contact switch.

Moreover, the pusher may be excluded with the result that the sensor-integrated illuminated sheet has the even back surface. This configuration imparts reduced thickness to the sensor-integrated illuminated key sheet.

A third common modification can exclude the operation section and have a display layer directly formed on the capacitance sensor. This configuration can enhance the sensitivity and accuracy of the slide input and impart reduced thickness to the sensor-integrated illuminated key sheet.

A fourth common modification can have the diffusion layers 13b formed on the surface, which is on the operation surface side, of the light guide sheet 13a or on the back surface of the light guide sheet 13a. This configuration can also divert the light path to the operation surface side.

REFERENCE SIGNS LIST

1 Smooth surface
2 Rough surface
11 Sensor-integrated illuminated key sheet (first embodiment)
12 Surface sheet (operation section)
13 Surface-type capacitance sensor
13a Light guide sheet (substrate)
13b Diffusion layer
13c Electrode
13d Transparent resin layer
14 Light-shielding print layer
15 Pusher sheet 15a Pusher
15b Base
21 Sensor-integrated illuminated key sheet (second embodiment)
  23 Surface-type capacitance sensor
  23a Light guide sheet (substrate)
  23b Diffusion layer
  23c Electrode
  23d Transparent resin layer
31 Sensor-integrated illuminated key sheet (third embodiment)
  31a Sensor-integrated illuminated key sheet (modification of third embodiment)
  32 Cover (operation section)
  32a Key top
  32b Base
41 Sensor-integrated illuminated key sheet (fourth embodiment)
  41a Sensor-integrated illuminated key sheet (modification of fourth embodiment)
  42 Cover (operation section)
  42a Key top
  42b Cover sheet
  42c Adhesive layer
  42d Space
51 Sensor-integrated illuminated key sheet (fifth embodiment)
  51a Sensor-integrated illuminated key sheet (modification of fifth embodiment)
  52a Key top (operation section)
  52c Adhesive layer
  52e Frame sheet (operation section)
61 Sensor-integrated illuminated key sheet (sixth embodiment)
  61a Sensor-integrated illuminated key sheet (modification of sixth embodiment)
  62 Cover (operation section)
  62a Key top
  62b Cover sheet
  62c Adhesive layer
  62d Space
  62e Frame sheet
71 Illuminated key sheet (seventh embodiment)
  71a Sensor-integrated illuminated key sheet (first modification of seventh embodiment)
  71b Sensor-integrated illuminated key sheet (second modification of sixth embodiment)
  71c Sensor-integrated illuminated key sheet (third modification of sixth embodiment)
  71d Sensor-integrated illuminated key sheet (fourth modification of sixth embodiment)
  71e Sensor-integrated illuminated key sheet (fifth modification of sixth embodiment)
  73 Projection-type capacitance sensor
  73a Light guide sheet (substrate)
  73b Diffusion layer
  73c First electrode
  73d Second electrode
  73e Transparent resin layer
  76 Projection-type capacitance sensor
  76a Light guide sheet (substrate)
  76b Diffusion layer
  76c First electrode
  76d Second electrode
  76e Transparent resin layer
111 Sensor-integrated illuminated key sheet (related art)
112 Key
113 Light guide panel
113a Protrusion
114 Pressing sheet
115 Coordinate-inputting unit
115a Substrate
115b First electrode
115c Second electrode
116 Air space

What is claimed is:

1. A sensor-integrated illuminated key sheet comprising:
a light guide sheet which transmits light;
an operation section provided so as to contact the operation surface side of the light guide sheet;
a capacitance sensor which serves for a slide input, and
a light-shielding print layer formed on the back side of the light guide sheet,
wherein the light guide sheet functions as the substrate of the capacitance sensor, and the capacitance sensor includes an electrode formed on at least any one of the operation surface side and back side of the light guide sheet, the back side being opposite to the operation surface side.

2. The sensor-integrated illuminated key sheet according to claim 1, wherein the operation section is a planar surface sheet having a certain thickness.

3. The sensor-integrated illuminated key sheet according to claim 1, further comprising:
a transparent resin layer formed between the light guide sheet and the electrode.

4. The sensor-integrated illuminated key sheet according to claim 3, wherein the transparent resin layer is made from a resin having a refractive index smaller than the refractive index of the light guide sheet.

5. The sensor-integrated illuminated key sheet according to claim 3, wherein the transparent resin layer and the light guide sheet have smooth surfaces which contact each other.

6. The sensor-integrated illuminated key sheet according to claim 1, further comprising:
a transparent resin layer formed between the light guide sheet and the electrode, the transparent resin layer being made from a resin having a refractive index smaller than the refractive index of the light guide sheet.

7. The sensor-integrated illuminated key sheet according to claim 6, wherein the operation section includes a plurality of key tops each having a block shape.

8. The sensor-integrated illuminated key sheet according to claim 7, wherein the operation section includes a frame sheet provided between the individual key tops.

9. The sensor-integrated illuminated key sheet according to claim 8, wherein the key tops and the frame sheet are individually made from materials having the same dielectric constant.

10. The sensor-integrated illuminated key sheet according to claim 7, wherein the key tops are formed on a cover sheet which overlies the operation surface side of the light guide sheet.

11. The sensor-integrated illuminated key sheet according to claim 10, wherein the cover sheet has a blasted surface which faces the light guide sheet.

12. The sensor-integrated illuminated key sheet according to claim 1, wherein the light-shielding print layer has substantially a same size as the light guide sheet.

* * * * *